United States Patent
Sagawa et al.

(10) Patent No.: US 9,769,933 B2
(45) Date of Patent: *Sep. 19, 2017

(54) PRINTED CIRCUIT BOARD AND METHOD OF MANUFACTURING THE SAME

(71) Applicant: Hitachi Metals, Ltd., Tokyo (JP)

(72) Inventors: Hideyuki Sagawa, Naka-gun (JP); Keisuke Fujito, Mito (JP); Takayuki Tsuji, Kitaibaraki (JP); Kotaro Tanaka, Naka-gun (JP); Hiromitsu Kuroda, Hitachi (JP)

(73) Assignee: HITACHI METALS, LTD., Tokyo (JP)

( * ) Notice: Subject to any disclaimer, the term of this patent is extended or adjusted under 35 U.S.C. 154(b) by 40 days.

This patent is subject to a terminal disclaimer.

(21) Appl. No.: 14/514,819

(22) Filed: Oct. 15, 2014

(65) Prior Publication Data

US 2015/0156870 A1   Jun. 4, 2015

(30) Foreign Application Priority Data

Nov. 29, 2013   (JP) .................................. 2013-248019

(51) Int. Cl.
| | |
|---|---|
| H05K 1/09 | (2006.01) |
| H05K 3/10 | (2006.01) |
| H05K 3/28 | (2006.01) |
| H05K 3/06 | (2006.01) |
| H05K 3/24 | (2006.01) |

(52) U.S. Cl.
CPC ............... *H05K 3/282* (2013.01); *H05K 3/06* (2013.01); *H05K 3/244* (2013.01); *H05K 2201/0341* (2013.01); *H05K 2201/0355* (2013.01); *H05K 2203/0315* (2013.01); *H05K 2203/087* (2013.01); *Y10T 29/49162* (2015.01)

(58) Field of Classification Search
None
See application file for complete search history.

(56) References Cited

U.S. PATENT DOCUMENTS

| | | | |
|---|---|---|---|
| 3,729,294 A | * | 4/1973 | Hibbs ..................... B05D 7/14 428/380 |
| 4,376,154 A | | 3/1983 | Nakatsugawa |
| | | (Continued) | |

FOREIGN PATENT DOCUMENTS

| | | |
|---|---|---|
| JP | 62-040361 | 2/1987 |
| JP | 1-205065 | 8/1989 |
| JP | 2000-323805 A | 11/2000 |
| JP | 2001-059198 | 3/2001 |

(Continued)

OTHER PUBLICATIONS

JP2007-208263 A_MT Aug. 16, 2007.*

(Continued)

*Primary Examiner* — Vera Katz
(74) *Attorney, Agent, or Firm* — Roberts Mlotkowski Safran Cole & Calderon P.C.

(57) ABSTRACT

A printed circuit board includes a substrate, and a wiring provided on the substrate. The wiring includes a copper-based metal wire provided on the substrate and a surface-treated layer provided on the copper-based metal wire. The copper-based metal wire includes mainly a copper. The surface-treated layer includes an amorphous layer including oxygen and a metal with a higher oxygen affinity than the copper.

6 Claims, 4 Drawing Sheets

(56) References Cited

U.S. PATENT DOCUMENTS

| | | |
|---|---|---|
| 8,637,163 B2 | 1/2014 | Tokuda et al. |
| 8,663,818 B2 | 3/2014 | Nose et al. |
| 2005/0127364 A1* | 6/2005 | Inoue .................. C22C 5/06 257/72 |
| 2009/0053555 A1 | 2/2009 | Nose et al. |
| 2010/0252322 A1* | 10/2010 | Sato ................ H01B 7/0275 174/72 A |
| 2011/0123729 A1* | 5/2011 | Lee ................. G02F 1/133512 428/1.6 |
| 2012/0318361 A1* | 12/2012 | Teeter ............. H01L 31/0326 136/264 |
| 2013/0048598 A1 | 2/2013 | Ushioda et al. |
| 2013/0323532 A1* | 12/2013 | Sagawa ............... B32B 15/01 428/659 |
| 2014/0209349 A1 | 7/2014 | Sagawa et al. |
| 2015/0152567 A1* | 6/2015 | Sagawa ............... C25D 7/0614 428/639 |

FOREIGN PATENT DOCUMENTS

| | | |
|---|---|---|
| JP | 2004-176082 | 6/2004 |
| JP | 2007-208263 | 8/2007 |
| JP | 2008-045203 | 2/2008 |
| JP | 2010-163641 | 7/2010 |
| WO | 2007/108496 A1 | 9/2009 |

OTHER PUBLICATIONS

Tan et al. Surface and Coatings Technology, 110(1998), 194-199.*
Park et al. Surface and Coatings Technology 200, 2005, 77-82.*
Japanese Office Action of JP2012-12586 dated Dec. 2, 2014 and English translation of Japanese Office Action of JP2012-125861 dated Dec. 2, 2014.
U.S. Office Action of U.S. Appl. No. 14/091,674 dated Apr. 28, 2015.
Japanese Application No. 2013-248019 Office Action dated Jan. 31, 2017 and English translation thereof.

* cited by examiner

PRINTED CIRCUIT BOARD AND METHOD OF MANUFACTURING THE SAME

The present application is based on Japanese patent application No. 2013-248019 filed on Nov. 29, 2013, the entire contents of which are incorporated herein by reference.

BACKGROUND OF THE INVENTION

1. Field of the Invention

The invention relates to a printed circuit board and a method of manufacturing the printed circuit board.

2. Description of the Related Art

When rolled copper foils and electrolytic copper foils are used as wiring materials for printed circuit board, the copper surface is usually oxidized and this causes deterioration in bondability when semiconductor components, etc., are soldered to the wiring.

A method is known in which Ni is plated on a copper surface and Au is further plated thereon so as to suppress oxidation of copper surface and thereby to improve solder bondability or wire-bonding properties (see JP-A-2013-16558, paragraph 0008).

Meanwhile, for the purpose of improving corrosion resistance of copper or copper alloy members, there is a method in which zinc (Zn) is plated on a surface of copper material and is subsequently diffused by heat treatment to form a copper-zinc (Cu—Zn) layer with a zinc (Zn) concentration of 10 to 40% (see JP-A-S62-040361).

Furthermore, in recent years, it was reported that amorphous alloys exhibit excellent corrosion resistance due to the structure in which atoms are densely packed (see WO2007/108496, JP-A-2008-045203, JP-A-2004-176082, JP-A-2001-059198 and JP-A-2010-163641).

SUMMARY OF THE INVENTION

In the method disclosed in JP-A-2013-16558, however, processes and Au material are expensive. In addition, Ni remains after ultrasonic bonding and functions as a resistive layer, which reduces conductivity.

Meanwhile, the examination by the present inventors revealed that even the copper-based member disclosed in JP-A-S62-040361 does not sufficiently exhibit satisfactory required performance of products, i.e., oxidation resistance in a long-term use at high temperature when used as, e.g., power and signal transmission cable conductors for automobiles and vehicles in which ambient temperature or the combination of ambient temperature and operating temperature reaches 100° C. or more.

In addition, the amorphous alloys disclosed in WO2007/108496, JP-A-2008-045203, JP-A-2004-176082, JP-A-2001-059198 and JP-A-2010-163641 are disadvantageous in that the manufacturing process is complicated since it is necessary to use a material formed by alloying plural metal elements, and a technique of forming an amorphous layer using a non-alloyed zinc element has not been sufficiently examined yet.

It is an object of the invention to provide a printed circuit board that is excellent in oxidation resistance, is formed at a lower cost than using a Ni/Au plating process and has high conductivity, as well as a method of manufacturing the printed circuit board.

(1) According to one embodiment of the invention, a printed circuit board comprises:
  a substrate; and
  a wiring provided on the substrate,
  wherein the wiring comprises a copper-based metal wire provided on the substrate and a surface-treated layer provided on the copper-based metal wire,
  wherein the copper-based metal wire comprises mainly a copper, and
  wherein the surface-treated layer comprises an amorphous layer comprising oxygen and a metal with a higher oxygen affinity than the copper.

In the above embodiment (1) of the invention, the following modifications and changes can be made.

(i) The surface-treated layer is provided on one side or both sides of the copper-based metal wire.

(ii) The amorphous layer further comprises a copper diffused from the copper-based metal wire.

(iii) The surface-treated layer further comprises a diffusion layer under the amorphous layer, and wherein the diffusion layer comprises a copper and a metal with a higher oxygen affinity than the copper, or oxygen, a copper and a metal with a higher oxygen affinity than the copper.

(iv) The metal with a higher oxygen affinity than the copper comprises zinc.

(v) The surface-treated layer has a thickness of not less than 3 nm and not more than 100 nm.

(2) According to another embodiment of the invention, a method of manufacturing a printed circuit board comprises:
  wiring a copper-based metal wire comprising mainly a copper on a substrate; and subsequently forming on a surface of the copper-based metal wire a layer comprising a metal with a higher oxygen affinity than a copper and then heat-treating the formed layer at a temperature of not less than 30° C. and not more than 300° C. for not less than 5 seconds and not more than 60 minutes so as to have a surface-treated layer.

(3) According to another embodiment of the invention, a method of manufacturing a printed circuit board comprises:
  forming a layer comprising a metal with a higher oxygen affinity than a copper on a surface of a copper-based metal wire comprising mainly a copper and then heat-treating the formed layer at a temperature of not less than 30° C. and not more than 300° C. for not less than 5 seconds and not more than 60 minutes so as to have a surface-treated layer and thereby form a wiring material with the surface-treated layer on the copper-based metal wire; and
  forming a wiring on the substrate by using the wiring material.

In the above embodiment (2) or (3) of the invention, the following modifications and changes can be made.

(vi) The metal with a higher oxygen affinity than copper is zinc.

(vii) The surface-treated layer has a thickness of not less than 3 nm and not more than 100 nm.

Effects of the Invention

According to one embodiment of the invention, a printed circuit board can be provided that is excellent in oxidation resistance, is formed at a lower cost than using a Ni/Au plating process and has high conductivity, as well as a method of manufacturing the printed circuit board.

BRIEF DESCRIPTION OF THE DRAWINGS

Next, the present invention will be explained in more detail in conjunction with appended drawings, wherein.

DETAILED DESCRIPTION OF THE PREFERRED EMBODIMENTS

Configuration of Printed Circuit Board

Printed circuit boards in the embodiments of the invention are each provided with a substrate and a wiring provided on the substrate. The wiring is provided with a copper-based metal wire provided on the substrate and a surface-treated layer provided on the copper-based metal wire. The copper-based metal wire includes mainly a copper. The surface-treated layer has an amorphous layer containing oxygen and a metal with a higher oxygen affinity than copper, and is provided on one or both sides of the copper-based metal wire.

Figure 1:
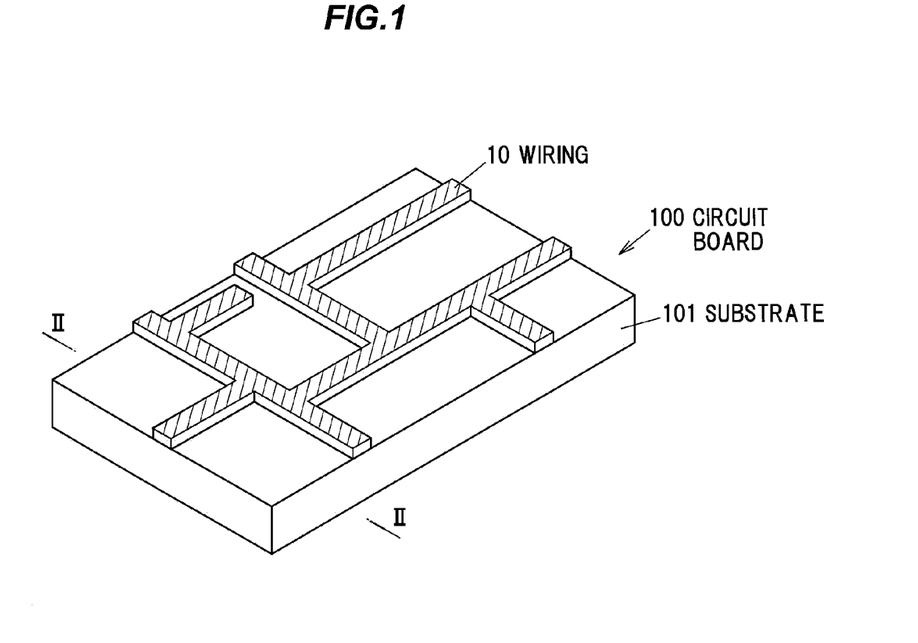
FIG. 1 is a schematic perspective view showing a printed circuit board in a first embodiment of the present invention.
Figure 2:
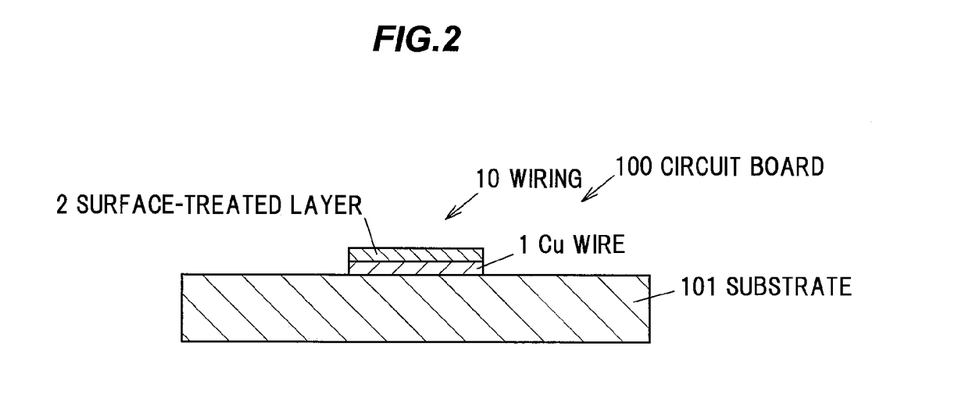
FIG. 2 is a cross sectional view taking on line II-II of FIG. 1.
Figure 3:
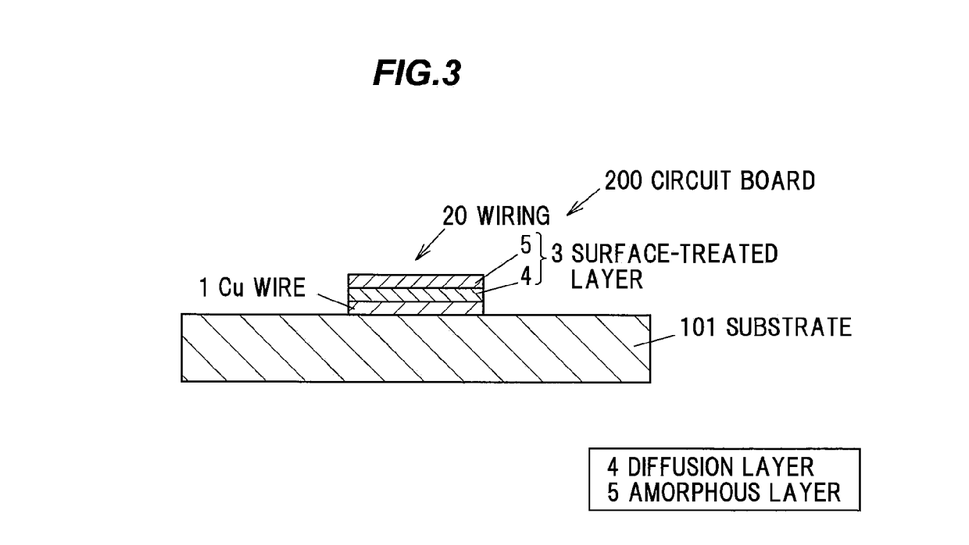
FIG. 3 is a cross sectional view showing a printed circuit board in a second embodiment of the invention and corresponding to FIG. 2.

FIG. 1 is a schematic perspective view showing a printed circuit board in the first embodiment of the invention and FIG. 2 is a cross sectional view taking on line II-II of FIG. 1. FIG. 3 is a cross sectional view showing a printed circuit board in the second embodiment of the invention and corresponding to FIG. 2.

A printed circuit board 100 shown in FIGS. 1 and 2 is provided with a substrate 101 and a wiring 10 provided on the substrate 101. The wiring 10 is provided with a Cu-based metal wire 1 (hereinafter, sometimes simply referred to as "Cu wire") having a rectangular cross section and a surface-treated layer 2 provided on a surface of the Cu-based metal wire 1 opposite to the surface arrange to face a surface of the substrate 101.

A material of the Cu wire 1 is not specifically limited as long as it is a copper-based metal material used for printed circuit boards, but it is preferable that the material includes mainly Cu which is contained in an amount of not less than 90 mass %. That is, Cu alone or a Cu alloy containing not more than 10 mass % of impurities is preferable. It is possible to use, e.g., pure copper such as oxygen-free copper or tough pitch copper, or dilute-copper alloys containing 3 to 15 mass ppm of sulfur, 2 to 30 mass ppm of oxygen and 5 to 55 mass ppm of Ti.

The thickness of the Cu wire 1 is preferably from 10 μm to 500 μm, more preferably from 10 μm to 400 μm, and further preferably from 10 μm to 200 μm. It is difficult to ensure conductivity when thinner than 10 μm, while the cost is increased when thicker than 500 μm. A width of the Cu wire 1 is appropriately determined depending on size, etc., of the circuit board.

The surface-treated layer 2 has an amorphous layer containing oxygen and a metal with a higher oxygen affinity than copper. Alternatively, the surface-treated layer 2 may have an amorphous layer containing oxygen, a metal with a higher oxygen affinity than copper and copper diffused from the Cu wire 1.

The surface-treated layer may be a surface-treated layer 3 having an amorphous layer 5 and a diffusion layer 4 which is formed thereunder and contains copper and a metal with a higher oxygen affinity than copper, or oxygen, copper and a metal with a higher oxygen affinity than copper, as is the second embodiment (a wiring 20 of a printed circuit board 200) shown in FIG. 3. The diffusion layer 4 is different from the amorphous layer 5 in that it is a crystalline layer.

The metal with a higher oxygen affinity than copper, which constitutes the surface-treated layer 2 (amorphous layer) and the amorphous layer 5, is preferably zinc. Besides zinc, it is possible to use, e.g., Ti, Mg, Zr, Al, Fe, Sn and Mn, etc. Ti, Mg and Zr, which are easily oxidized and removed at the time of manufacturing copper, are particularly preferable from the viewpoint of recycling. The same applies to the metal with a higher oxygen affinity than copper, which constitutes the diffusion layer 4, and it is preferable to use the same metal as the metal with a higher oxygen affinity than copper, which constitutes the amorphous layer.

The amorphous layer with randomly-arranged elements is considered to have a denser structure than a crystalline layer with regularly-arranged elements. Therefore, copper diffusion to the surface of the surface-treated layer and oxygen ingress into a copper raw material, which cause oxidation of the copper raw material, are suppressed or reduced by the amorphous layer. It is believed that the amorphous layer thereby serves as a barrier layer which inhibits bonding between copper and oxygen.

Oxygen needs to preferentially bond to a metal other than copper so that the amorphous layer is formed. Then, in order to accelerate the formation of the amorphous layer, it is preferable that a metal with a higher oxygen affinity than copper (e.g., zinc) be arranged on the surface of the Cu wire 1.

Different types of elements are in contact with each other at an interface between the surface-treated layers 2 and 3 and another layer and a gradual concentration change is generally seen at such an interface, which makes difficult to define the thickness of the surface-treated layer. Therefore, the thickness of the surface-treated layer in the invention is defined as "a thickness of a layer which contains oxygen, a metal with a higher oxygen affinity than copper and, in some cases, copper, and in which each of the constituent elements is contained in the amount of not less than 2 at % in terms of atomic concentration (at %) as an elemental content ratio".

The thickness of the surface-treated layer 2 is preferably not less than 3 nm and not more than 100 nm depending on the heat treatment conditions, more preferably not less than 5 nm and not more than 70 nm, and further preferably not less than 6 nm and not more than 50 nm. Meanwhile, the thickness of the surface-treated layer 3 is preferably not less than 6 nm and not more than 100 nm as the total of the thickness of the diffusion layer 4 and the thickness of the amorphous layer 5.

When the diffusion layer 4 is provided, the lower limit of the thickness thereof is not specifically limited as long as the Cu wire 1 is covered, and the lower limit of coating thickness is preferably about 3 nm in effect. In addition, the upper limit of the thickness of the diffusion layer 4 is preferably not more than 80 nm. When the diffusion layer 4 is more than 80 nm, the amorphous layer 5 contributing to develop high corrosion resistance may be stabilized and become less likely to be formed. The thickness of the amorphous layer 5 is not specifically limited but is preferably not less than 3 nm.

The total thickness of the Cu wire 1 and the surface-treated layer 2 or 3 is preferably less than 0.55 mm, more preferably not less than 20 nm and not more than 0.5 mm, and further preferably not less than 20 nm and not more than 0.3 mm. It is difficult to ensure conductivity when too thin, while the cost is increased when too thick.

Method of Manufacturing Printed Circuit Board

Next, a method of manufacturing the printed circuit boards in the present embodiments will be described.

<Manufacturing Method 1> Form Surface-Treated Layer after Forming Wiring on Substrate A Cu foil is adhered onto the substrate 101 by an adhesive and the Cu wire 1 is then formed by etching. After that, in case that a metal with a higher oxygen affinity than copper is, e.g., zinc, a Zn layer is formed on the surface of the Cu wire 1 by electrolytic plating in size and shape of the finished product. By subsequent heating in the ambient air at a temperature of not less than 30° C. and not more than 300° C. for not less than 5 seconds and not more than 60 minutes, the surface-treated layer 2 (amorphous layer) is formed. The thickness of the Zn layer is preferably not less than 3 nm and not more than 100 nm, more preferably not less than 5 nm and not more than 70 nm, and further preferably not less than 6 nm and not more than 50 nm. A wiring provided with the surface-treated layer 2 having the amorphous layer containing at least zinc and oxygen is thus obtained. In other words, it is possible to form the surface-treated layer 2 (amorphous layer) on the surface of the Cu wire 1 by a simple method in which a zinc cover layer is simply provided and heat-treated under the predetermined conditions.

<Manufacturing Method 2> Form Wiring on Substrate after Forming Surface-Treated Layer A Cu foil with the surface-treated layer(s) 2 (on one or both sides) formed by the above method is attached onto the substrate 101 by an adhesive, and subsequently, a wiring formed of the Cu wire 1 having the surface-treated layer(s) 2 is shaped by etching. Alternatively, the wiring may be formed by attaching a Cu foil onto the substrate 101, forming the surface-treated layer(s) 2 on the Cu foil and then performing the etching.

In the present embodiments, the cover layer is heat-treated preferably at a temperature of not less than 30° C. and not more than 300° C. for not less than 5 seconds and not more than 60 minutes as described above, more preferably, at a temperature of not less than 50° C. and not more than 150° C. for not less than 30 seconds and not more than 15 minutes. In addition, a plating process can be suitably used for forming the Zn layer. In addition to the plating process, it is possible to use a sputtering method, a vacuum deposition method and a cladding process, etc.

Alternatively, as a manufacturing method in another embodiment, the surface-treated layer 2 (amorphous layer) may be formed by preliminarily plating zinc before processing into the size and shape of the finished product and heat-treating after processing into the size and shape of the finished product.

Meanwhile, the diffusion layer 4 can be formed by, e.g., covering the surface of the Cu wire 1 with zinc before forming the amorphous layer 5 of the surface-treated layer 3 and then heating in the ambient air or holding in an oil bath or salt bath at a temperature of not less than 50° C. Alternatively, the diffusion layer 4 may be manufactured using electric resistance heat. After that, the amorphous layer 5 is formed on the surface of the diffusion layer 4 by the same method as that used for forming the surface-treated layer 2 (amorphous layer).

Effects of the Embodiments

In the embodiments of the invention, oxidation of the copper-based metal wire can be suppressed since the surface-treated layer 2 or 3, which serves as a barrier layer for suppressing or reducing copper diffusion to the surface of the surface-treated layer and oxygen ingress into the copper-based metal wire, is formed on the surface of the copper-based metal wire. Therefore, it is possible to improve solder bondability or wire-bonding properties between semiconductor components, etc., and the wiring.

In addition, in the embodiments of the invention, it is possible to manufacture printed circuit boards at a lower cost since a Ni/Au plating is not required. Furthermore, as compared to the Ni/Au plating which causes a decrease in conductivity due to Ni remaining after ultrasonic bonding and functioning as a resistive layer, the surface-treated layer (amorphous layer) of the invention does not remain after soldering or does not become a resistive layer due to its extremely small thickness and a printed circuit board with high conductivity is thus obtained. In addition, while flexibility of the printed circuit board is decreased in case of the Ni/Au plating process since the Ni/Au plating layer is relatively thick and hard, the surface-treated layer (amorphous layer) of the invention is thin and the printed circuit board is thus excellent in flexibility.

The following examples further illustrate the invention but the invention is not limited thereto.

EXAMPLES

Table 1 shows the configurations of the samples in Examples 1 to 6 and Comparative Examples 1 to 5. Table 1 also shows the evaluation results of the evaluation items described later. In Examples, the evaluated samples are Cu sheets, not Cu wires, so that the evaluation is simplified.

TABLE 1

|  |  | | Surface-treated layer | | Evaluation results Oxidation resistance |
|---|---|---|---|---|---|
|  |  | Sheet material | Material thickness (μm) | Presence of amorphous layer |  |
| Examples | 1 | Cu | Zn | 0.003 | present | ○ |
|  | 2 | Cu | Zn | 0.006 | present | ⊚ |
|  | 3 | Cu | Zn | 0.01 | present | ⊚ |
|  | 4 | Cu | Zn | 0.05 | present | ⊚ |
|  | 5 | Cu | Zn | 0.1 | present | ○ |
|  | 6 | Cu | Zn | 0.1 | present | ○ |
| Comparative Examples | 1 | Cu | Zn | 1.0 | not present | X |
|  | 2 | Cu | Zn | 0.02 | not present | Δ |
|  | 3 | Cu | Zn | 0.02 | not present | X |
|  | 4 | Cu | — | — | not present | X |
|  | 5 | Cu—Zn alloy | — | — | not present | Δ |

The samples in Examples 1 to 6 shown in Table 1 were generally made as follows: a cover layer formed of zinc plating with various thickness (0.002 to 0.08 μm) was formed on a flat sheet formed of tough pitch copper by electrolytic plating and annealing was then performed in the ambient air. The details of Examples 1 to 5 and Comparative Examples 1 to 5 will be described later.

Meanwhile, in Comparative Example 1 for evaluating influence of the thickness of the zinc layer on the characteristics of the Cu-based metal material (Cu sheet), a zinc layer with a different thickness was formed and heat treatment was then performed in the same manner as Example 1. In Comparative Examples 2 and 3 for evaluating influence of the heat treatment conditions on the characteristics of the Cu-based metal material (Cu sheet), the sample was made under a different heat treatment condition (Comparative Example 2) or was made without heat treatment (Comparative Example 3).

Furthermore, as the samples of Comparative Examples 4 and 5, tough pitch copper (Comparative Example 4) and a Cu-30 mass % Zn alloy (Comparative Example 5) were prepared.

Presence of the amorphous layer shown in Table 1 was confirmed by RHEED analysis (Reflection High Energy Electron Diffraction). The samples showing a halo pattern indicating presence of the amorphous layer are indicated by "Present", and the samples showing electron diffraction spots indicating a crystalline structure are indicated by "Not present".

Here, oxidation resistance evaluation of the obtained samples shown in Table 1 was performed as follows.

For evaluating "oxidation resistance", each sample was kept in the ambient air in a constant-temperature oven set at 100° C. for up to 1000 hours and an increase in oxide film was measured after the test. Based on comparison with the initial thickness (before the test) of the oxide film, the samples with the least change were evaluated as "⊚ (excellent)", the samples with the most significant change and with associated deterioration were evaluated as "X (bad)", and the samples with the change in-between were evaluated as either "○ (acceptable)" or "Δ (unacceptable)" depending on the extent of the change. Using comparison results with the initial thickness (before the test) of the oxide film as quantitative criteria, the samples of which oxide film after 1000 hours has a thickness three times or more were all evaluated as "X" regardless of the change in appearance. Here, ⊚ and ○ are judged as "passed the test" and Δ and X are judged as "failed the test".

The details of Examples 1 to 6 and Comparative Examples 1 to 5 are described below.

Example 1

A 0.5 mm-thick flat sheet formed of pure Cu (tough pitch copper; hereinafter, described as "TPC") was prepared, a 0.002 µm-thick cover layer formed of zinc was then formed on a surface of the flat sheet by electrolytic plating and heat treatment was subsequently performed in the ambient air at a temperature of 30° C. for 10 minutes, thereby obtaining a sample provided with a surface-treated layer. Based on Auger analysis performed on the obtained sample from the surface in a depth direction, it was confirmed that a 0.003 µm-thick surface-treated layer composed of zinc (Zn), oxygen (O) and copper (Cu) was formed.

Example 2

In Example 2, a 0.5 mm-thick flat sheet formed of TPC was prepared, a 0.005 µm-thick Zn layer was then formed on a surface of the flat sheet by electrolytic plating and heat treatment was subsequently performed in the ambient air at a temperature of 50° C. for 1 hour, thereby obtaining a sample. Based on Auger analysis performed on the obtained sample from the surface in a depth direction, it was confirmed that a 0.006 µm-thick surface-treated layer composed of zinc (Zn), oxygen (O) and copper (Cu) was formed.

Example 3

In Example 3, a 0.5 mm-thick flat sheet formed of TPC was prepared, a 0.008 µm-thick Zn layer was then formed on a surface of the flat sheet by electrolytic plating and heat treatment was subsequently performed in the ambient air at a temperature of 100° C. for 5 minutes, thereby obtaining a sample. Based on Auger analysis performed on the obtained sample from the surface in a depth direction, it was confirmed that a 0.01 µm-thick surface-treated layer composed of zinc (Zn), oxygen (O) and copper (Cu) was formed.

Example 4

In Example 4, a 0.5 mm-thick flat sheet formed of TPC was prepared, a 0.04 µm-thick Zn layer was then formed on a surface of the flat sheet by electrolytic plating and heat treatment was subsequently performed in the ambient air at a temperature of 120° C. for 10 minutes, thereby obtaining a sample. Based on Auger analysis performed on the obtained sample from the surface in a depth direction, it was confirmed that a 0.05 µm-thick surface-treated layer composed of zinc (Zn), oxygen (O) and copper (Cu) was formed.

Example 5

In Example 5, a 0.5 mm-thick flat sheet formed of TPC was prepared, a 0.08 µm-thick Zn layer was then formed on a surface of the flat sheet by electrolytic plating and heat treatment was subsequently performed in the ambient air at a temperature of 150° C. for 30 seconds, thereby obtaining a sample. Based on Auger analysis performed on the obtained sample from the surface in a depth direction, it was confirmed that a 0.1 µm-thick surface-treated layer composed of zinc (Zn), oxygen (O) and copper (Cu) was formed.

Example 6

In Example 6, a 0.5 mm-thick flat sheet formed of TPC was prepared, a 0.08 µm-thick Zn layer was then formed on a surface of the flat sheet by electrolytic plating and heat treatment was subsequently performed in the ambient air at a temperature of 300° C. for 5 seconds, thereby obtaining a sample. Based on Auger analysis performed on the obtained sample from the surface in a depth direction, it was confirmed that a 0.1 µm-thick surface-treated layer composed of zinc (Zn), oxygen (O) and copper (Cu) was formed.

Comparative Example 1

In Comparative Example 1, a 0.5 mm-thick flat sheet formed of TPC was prepared, a 0.95 µm-thick Zn layer was then formed on a surface of the flat sheet by electrolytic plating and heat treatment was subsequently performed in the ambient air at a temperature of 100° C. for 5 minutes, thereby obtaining a sample. Based on Auger analysis performed on the obtained sample from the surface in a depth direction, it was confirmed that a 1 µm-thick surface-treated layer composed of zinc (Zn) and oxygen (O) was formed.

Comparative Example 2

In Comparative Example 2, a 0.5 mm-thick flat sheet formed of TPC was prepared, a 0.01 µm-thick Zn layer was then formed on a surface of the flat sheet by electrolytic plating and heat treatment was subsequently performed in the ambient air at a temperature of 400° C. for 60 seconds, thereby obtaining a sample. Based on Auger analysis performed on the obtained sample from the surface in a depth direction, it was confirmed that a 0.02 μm-thick surface-treated layer composed of zinc (Zn), oxygen (O) and copper (Cu) was formed.

Comparative Example 3

In Comparative Example 3, a 0.5 mm-thick flat sheet formed of TPC was prepared and a 0.02 μm-thick Zn layer was then formed on a surface of the flat sheet by electrolytic plating, thereby obtaining a sample.

Comparative Example 4

In Comparative Example 4, a 0.5 mm-thick flat sheet formed of TPC was used as an evaluation sample.

Comparative Example 5

In Comparative Example 5, a 0.5 mm-thick flat sheet formed of Cu-30 mass % Zn alloy (brass) was used as an evaluation sample.

Figure 4:
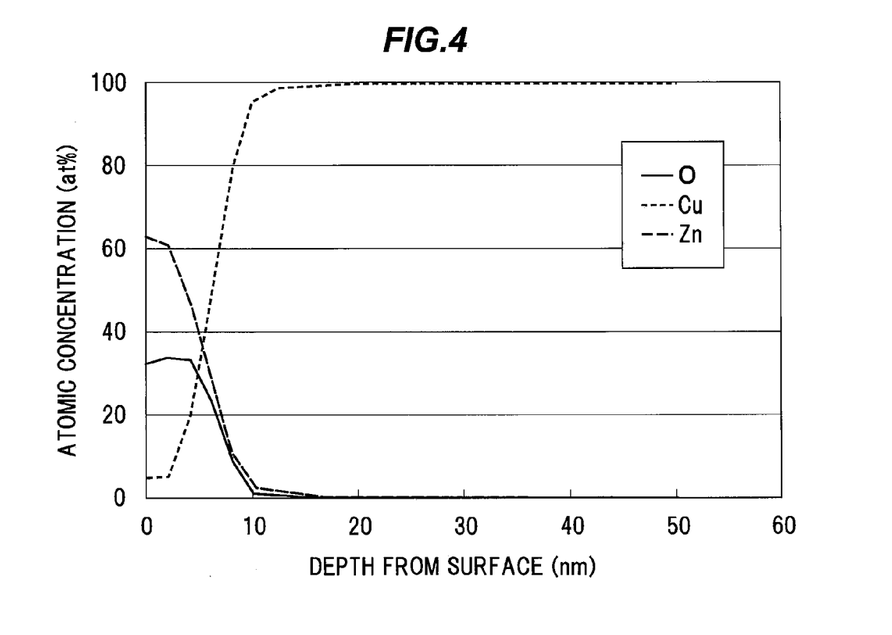
FIG. 4 is a graph showing the results of Auger elemental analysis performed on a sample in Example 3 of the invention, where the sample after 3600 hours of a constant temperature test (at 100° C.) is analyzed from the surface in a depth direction while repeating sputtering.

FIG. 4 is a graph showing the results of Auger elemental analysis performed on the sample in Example 3, where the sample after 3600 hours of a constant temperature test (at 100° C.) is analyzed from the surface in a depth direction while repeating sputtering. The horizontal axis indicates a depth (nm) from the surface and the vertical axis indicates an atomic concentration (at %). Then, a solid line shows the atomic concentration (at %) as the ratio of the oxygen content, a long-dashed line shows the atomic concentration of zinc and a short-dashed line shows the atomic concentration of copper. The oxygen penetration depth was about 8 nm from the surface, and the average elemental content of each element particularly in the surface portion at a depth of 0 to 3 nm, which is defined as [the maximum atomic concentration+the minimum atomic concentration (at the depth of 0 to 3 nm)]/2, was 60 at % for zinc (Zn), 33 at % for oxygen (O) and 7 at % for copper (Cu) in Example 3.

In addition, based on the results including other Examples, it was found that the average elemental content of zinc (Zn) was in a range of 35 to 68 at %, that of oxygen (O) in a range of 30 to 60 at % and that of copper (Cu) in a range of 0 to 15 at %.

On the other hand, the sample in Comparative Example 1 contained 33 at % of zinc (Zn), 41 at % of oxygen (O) and 26 at % of copper (Cu), and the sample in Comparative Example 5 contained 5 at % of zinc (Zn), 46 at % of oxygen (O) and 49 at % of copper (Cu).

Figure 5:
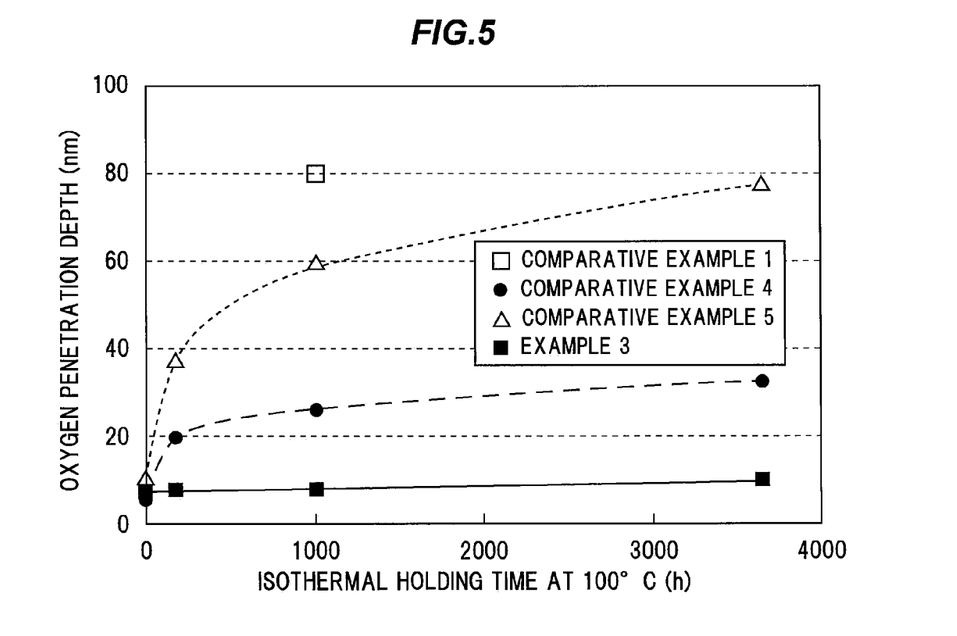
FIG. 5 is a graph showing time-dependent change in an oxygen penetration depth from the surface layer (thickness of oxide film) in the constant temperature test (at 100° C.) conducted on samples in Example 3 of the invention and Comparative Examples 1, 4 and 5.

FIG. 5 is a graph showing time-dependent change in an oxygen penetration depth from the surface layer (thickness of oxide film) in the constant temperature test (at 100° C.) conducted on the samples in Example 3 and Comparative Examples 1, 4 and 5. The oxygen penetration depth was derived by Auger analysis performed on the samples held for various periods of time from the surface in a depth direction while repeating sputtering. In FIG. 5, the horizontal axis indicates isothermal holding time (h) at 100° C. and the vertical axis indicates the oxygen penetration depth (nm). Then, a solid line shows oxygen penetration depth in Example 3 and dashed lines show the oxygen penetration depth in Comparative Example 4 and that in Comparative Example 5. Comparative Example 1 is indicated by a single point.

In Example 3, as shown in FIG. 4, the oxygen concentration in the vicinity of the surface increased after holding 3600 hours but the penetration depth of oxygen hardly changed before and after the test and was about not more than 0.01 μm, which shows that the sample in Example 3 has high oxidation resistance.

Meanwhile, as shown in FIG. 5, a thickness of an oxygen-containing layer before the constant temperature test was about 0.006 μm from the surface in both Comparative Example 4 (tough pitch copper) and Comparative Example 5, which is comparable to the depth before the test in Example 3. However, after the 3600 hours of the holding test, the oxygen concentration in the vicinity of the surface in Comparative Example 4 significantly increased as compared to that before the constant temperature test, and also, the oxygen penetration depth in Comparative Example 4 was about 0.036 μm which is 5 times or more of that before the test and the oxygen penetration depth in Comparative Example 5 was about 0.078 μm which is 13 times that before the test. In addition, in Comparative Examples 4 and 5, reddish brown discoloration was observed on the appearance after the test and it was obvious that a thick oxygen-containing layer was formed. In addition, in Comparative Examples 1 in which a 0.95 μm-thick Zn layer is formed on TPC, the oxygen penetration depth already reached about 0.080 μm after 1000 hours of the holding test.

Figure 6:
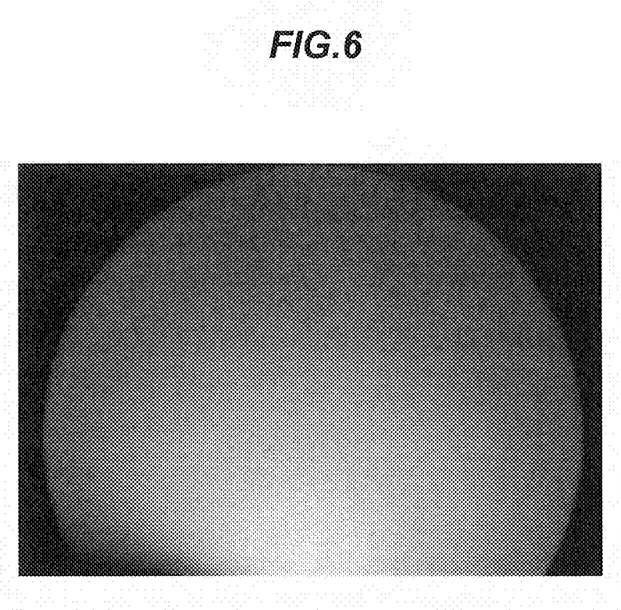
FIG. 6 is an electron diffraction image showing the result of RHEED analysis performed on the sample in Example 3 of the invention.

FIG. 6 shows the result of RHEED analysis performed on the surface of the sample in Example 3 which is excellent in oxidation resistance. A halo pattern is shown in the electron diffraction image and this reveals that an amorphous layer is formed on the surface as shown in Table 1. On the other hand, it was confirmed that the sample in Comparative Example 4 having less oxidation resistance was a crystalline substance composed of copper and oxygen.

In addition, according to Table 1, in Examples 1 to 6 in which surface-treated layers with various thicknesses of 0.003 to 0.1 μm are respectively provided and each have an amorphous structure, good results were obtained from the evaluation of oxidation resistance. Excellent characteristics were exhibited especially when the thickness of the surface-treated layer was 0.006 to 0.05 μm.

From the above results, it was confirmed that, in the structures of Examples 1 to 6, the process of oxidation does not occur and a stable surface condition is maintained even in the constant temperature test at 100° C. for 1000 hours and also under the environment of 85° C. and 85% of humidity.

On the other hand, satisfactory characteristics were not obtained in some cases in Comparative Examples 1 to 3 even though a Zn-based surface-treated layer is provided in the same manner. The evaluation result of oxidation resistance is "Fail" for all of the samples in which an amorphous surface layer was not formed, such as Comparative Example 1 with thick zinc, Comparative Example 2 with excessive heat treatment after plating and Comparative Example 3 with no heat treatment after plating.

From the above results, it was confirmed that the heat treatment is preferably performed in the ambient air at not less than 30° C.

As for the cost performance (economic performance), Examples 1 to 6 do not require, e.g., coating of noble metal excellent in oxidation resistance of material per se but expensive, uses cheap Zn with very small thickness, and are thus extremely excellent in productivity and economic performance.

It should be noted that the invention is not intended to be limited to the embodiments and the examples, and various kinds of modifications can be implemented.

What is claimed is:

1. A printed circuit board, comprising:
   a substrate; and
   a wiring provided on the substrate, the wiring comprising
      a copper-based metal wire having an upper surface provided on the substrate, and
      a surface-treated layer coextensive with the upper surface, and comprising
         an amorphous layer comprising oxygen and a metal having a higher oxygen affinity than copper the metal consisting of zinc,
   wherein the surface-treated layer directly contacts the upper surface of the copper-based metal wire.

2. The printed circuit board according to claim 1, wherein the surface-treated layer is provided on the upper surface, or the upper surface and a lower surface, of the copper-based metal wire.

3. The printed circuit board according to claim 1, wherein the amorphous layer further comprises copper diffused from the copper-based metal wire.

4. The printed circuit board according to claim 1, wherein the surface-treated layer further comprises a diffusion layer under the amorphous layer, and wherein the diffusion layer comprises a copper and a second metal with a higher oxygen affinity than the copper, or oxygen, a copper and a second metal with a higher oxygen affinity than copper.

5. The printed circuit board according to claim 1, wherein the surface-treated layer has a thickness of not less than 3 nm and not more than 100 nm.

6. The printed circuit board according to claim 1, wherein the amorphous layer consists essentially of oxygen, the metal consisting of zinc, and copper diffused into the amorphous layer from the copper-based metal wire.

* * * * *